United States Patent [19]

Haour et al.

[11] Patent Number: 4,719,962

[45] Date of Patent: Jan. 19, 1988

[54] METHOD FOR SELECTIVELY FORMING AT LEAST ONE COATING STRIP CONSISTING OF A METAL OR ALLOY ON A SUBSTRATE CONSISTING OF ANOTHER METAL

[75] Inventors: Georges Haour, Geneva; Dag F. Richter, Carouge; Peter Boswell, Acacias/Geneva; Willy Wagnieres, Grand-Lancy, all of Switzerland

[73] Assignee: Battelle Memorial Institute, Geneva, Switzerland

[21] Appl. No.: 933,748

[22] PCT Filed: Feb. 25, 1986

[86] PCT No.: PCT/CH86/00026

§ 371 Date: Nov. 3, 1986

§ 102(e) Date: Nov. 3, 1986

[87] PCT Pub. No.: WO86/05213

PCT Pub. Date: Sep. 12, 1986

[30] Foreign Application Priority Data

Mar. 4, 1985 [CH] Switzerland .................. 963/85

[51] Int. Cl.⁴ ................................ B22D 11/00
[52] U.S. Cl. ........................ 164/461; 164/463; 427/319; 427/328
[58] Field of Search ........... 164/268, 461, 463; 427/318–321, 327–330, 431

[56] References Cited

U.S. PATENT DOCUMENTS

| 2,959,829 | 11/1960 | Brennan | 164/474 |
| 3,201,275 | 8/1965 | Alplaus | 427/38 |
| 4,033,398 | 7/1977 | Laithwaite | 164/268 |
| 4,596,207 | 6/1986 | Witt et al. | 164/461 |

FOREIGN PATENT DOCUMENTS

| 0023472 | 2/1981 | European Pat. Off. |
| 2134444 | 1/1972 | Fed. Rep. of Germany |
| 860375 | 1/1941 | France |
| 923246 | 7/1947 | France |
| 1153715 | 3/1958 | France |
| 1584626 | 12/1969 | France |

Primary Examiner—Nicholas P. Godici
Assistant Examiner—Richard K. Seidel
Attorney, Agent, or Firm—Cushman, Darby & Cushman

[57] ABSTRACT

The metal substrate (4) is covered with a coating (6) consisting of another metal or alloy having a thickness of 4 to 50 μm, by deposition of molten metal or alloy (5) through a nozzle (2), this melting point [sic] being lower than that of the substrate metal. This coating comprises, at the interface with the substrate, a layer of intermetallic compound with a thickness of between 0.5 and 4 μm not exceeding 40% of the total thickness, the remainder consisting of the initial metal or alloy used for the coating, in a proportion of between 97% and 99.5% by weight.

7 Claims, 4 Drawing Figures

METHOD FOR SELECTIVELY FORMING AT LEAST ONE COATING STRIP CONSISTING OF A METAL OR ALLOY ON A SUBSTRATE CONSISTING OF ANOTHER METAL

The present invention relates to a method for selectively forming at least one coating strip consisting of a metal or alloy on a substrate consisting of another metal.

There are several methods for coating a metal substrate with another metal. In particular, there is electroplasting, chemical vapour deposition (CVD) and physical vapour deposition (PVD), hot roll-bonding methods and finally coating methods which use molten metal, either by dipping the substrate in a liquid-metal bath, as in the case of zinc coating, or by depositing the liquid metal on the substrate.

The electrolytic and the CVD and PVD methods are expensive because of the time they require, and roll bonding proves to be a delicate operation when layers in particular of the order of 10 to 40 $\mu$m are required. For their part, the coating methods which use a molten metal or alloy have the drawback that it is difficult to control the structure of the coating. In fact, when a hot substrate is coated with molten metal, there must be proper wetting of the substrate metal by the molten coating metal. This wetting action is dependent on the contact time and the temperature at which this contact occurs. During this wetting process, diffusion of the substrate metal into the coating metal occurs. This diffusive process is interrupted by the formation of an intermetallic compound between the substrate and the coating metal and by solidification of the coating. In certain applications, in particular electrical applications where the resistivity of the coating is a factor of primary importance, the presence of an alloy formed as a result of dissolution of the substrate metal is not acceptable, since most of the coating must consist of metal or alloy with a purity preferably higher than 99%. In view of the fact that, during wetting of the substrate, a more or less large amount of the substrate metal diffuses into the coating metal or alloy, thereby ensuring good adhesion of the coating, it has not been possible to use the numerous deposition methods which employ molten metal or alloy, for a number of electrical and electronic applications in particular, e.g. for integrated circuit connection bases or for electrical contact elements. The use of such methods would result in a considerable increase in the productivity of the coating operations used for these substrates.

In No. FR-A-1,584,626 it has already been proposed to coat a steel strip with a layer of aluminium or aluminium alloy by passing this strip vertically from the bottom upwards through a vertical slit of a supply nozzle connected to a crucible containing molten aluminium. As it passes into the liquid aluminium contained inside the vertical slit, the strip, which moves from the bottom upwards, creates capillary forces which counterbalance the gravitational force exerted on the liquid and is covered with metal at the outlet of this slit. After solidification, a steel strip coated with aluminium is obtained. This is a method, therefore, by means of which it is possible to obtain layers of 20 to 100 $\mu$m thickness, a layer of intermetallic compound with a thickness no greater than 2 $\mu$m being formed at the interface.

Using such a method, selective coatings in the form of strips cannot be obtained on a substrate; the latter can only be coated. It is not possible, using this method, to obtain coatings with thicknesses as small as 4 $\mu$m. However, there are numerous applications, particularly in electronics, where it is necessary to provide coatings in the form of strips, whose thickness is less than 10 $\mu$m. As the thickness of the coating decreases, the throughput of metal is reduced by a proportionate amount. Consequently, in the case of the method described in the abovementioned document, in which the liquid metal is kept in equilibrium by the capillary forces of the strip which moves from the bottom upwards, if the throughput of metal is reduced, the dwell time of the molten metal inside the nozzle increases, thereby giving rise to the danger that this molten metal may be gradually contaminated by the substrate metal, dissolution of which, in view of the volume of liquid metal stagnating inside the nozzle, may spread into this mass of metal during the course of the process. Consequently, even if it is possible to limit the thickness of the intermetallic layer to at least 2 $\mu$m, the purity of the remainder of the coating metal will probably be reduced significantly, i.e. by more than 2 to 3% compared to its initial purity, thereby excluding certain applications, particularly in the area of electronics.

The probability of this occurring is even greater since, unlike the sole application described in No. FR-A-1,585,626, where an aluminium or aluminium alloy layer is deposited only on a stainless or martensitic steel substrate, in applications intended for electronics, the coating consists of aluminium or a Pb - Sn alloy and is deposited in particular on a substrate of Cu/Sn, Fe, Cu, Fe/Ni, etc. The dissolution speeds of the substrate metals used for these applications are all faster than those of stainless or martensitic steel.

It will be understood, therefore, that even though techniques for coating a metal substrate with another metal have existed for more than 50 years and have been used in numerous applications as described in the literature on the subject, it has not yet been possible to coat substrates with very thin metal strips, having a thickness in particular of less than 20 $\mu$m or even less than 10 $\mu$m and consisting of metal with a purity of the order of 99% over 4/5ths of its thickness, using this technique which has been reserved hitherto solely for technologies with less stringent requirements.

The object of the present invention is to modify the technology of coating substrates with strips by means of liquid metal deposition such that the most stringent norms as regards purity are satisfied; at present such substrates can only be obtained using the abovementioned deposition methods, the productivity of which is very substantially lower than that of the liquid-metal deposition method.

To this end, the present invention relates to a method for selectively forming at least one coating strip consisting of a metal or alloy with a thickness of 4 to 50 $\mu$m, on a substrate consisting of another metal, the melting point of which is higher than that of the coating according to claim 1.

The advantages of this method obviously lie in its increased productivity compared to the methods of the state of the art. As will be demonstrated by the examples given below, this method enables the nature of the deposited layer to be perfectly controlled, whatever the metal of the substrate and whatever the metal or alloy deposited on it. The metal or alloy of all the metal strips thus deposited, above the intermetallic layer of limited thickness, has a purity substantially equal to that of the initial metal or alloy. Moreover, the cross-section of the strip of metal deposited is rectangular and hence constant and its width is regular.

The advantage of this invention is that it allows metal substrates coated with molten metal or alloy to be produced, without an inadmissably high degree of diffusion of the substrate metal into the coating occurring in a portion of the thickness of the coating such that the physical properties of the chosen metal or alloy are affected and to such an extent that the substrate is not suitable, for example, for specific applications which require precisely these properties. Thus, it is possible to provide, on conducting substrates, tracks intended for connecting integrated circuits which have a thickness of the order of 10 $\mu$m and most of which must consist of the coating metal with a purity higher than 98%.

The attached drawing shows, schematically and by way of example, the essential parts of a plant for producing the metal substrate which is the subject of the invention and diagrams relating to the operating parameters of this plant FIG. 1 is a general vertical section of the coating plant.

Figure 1:
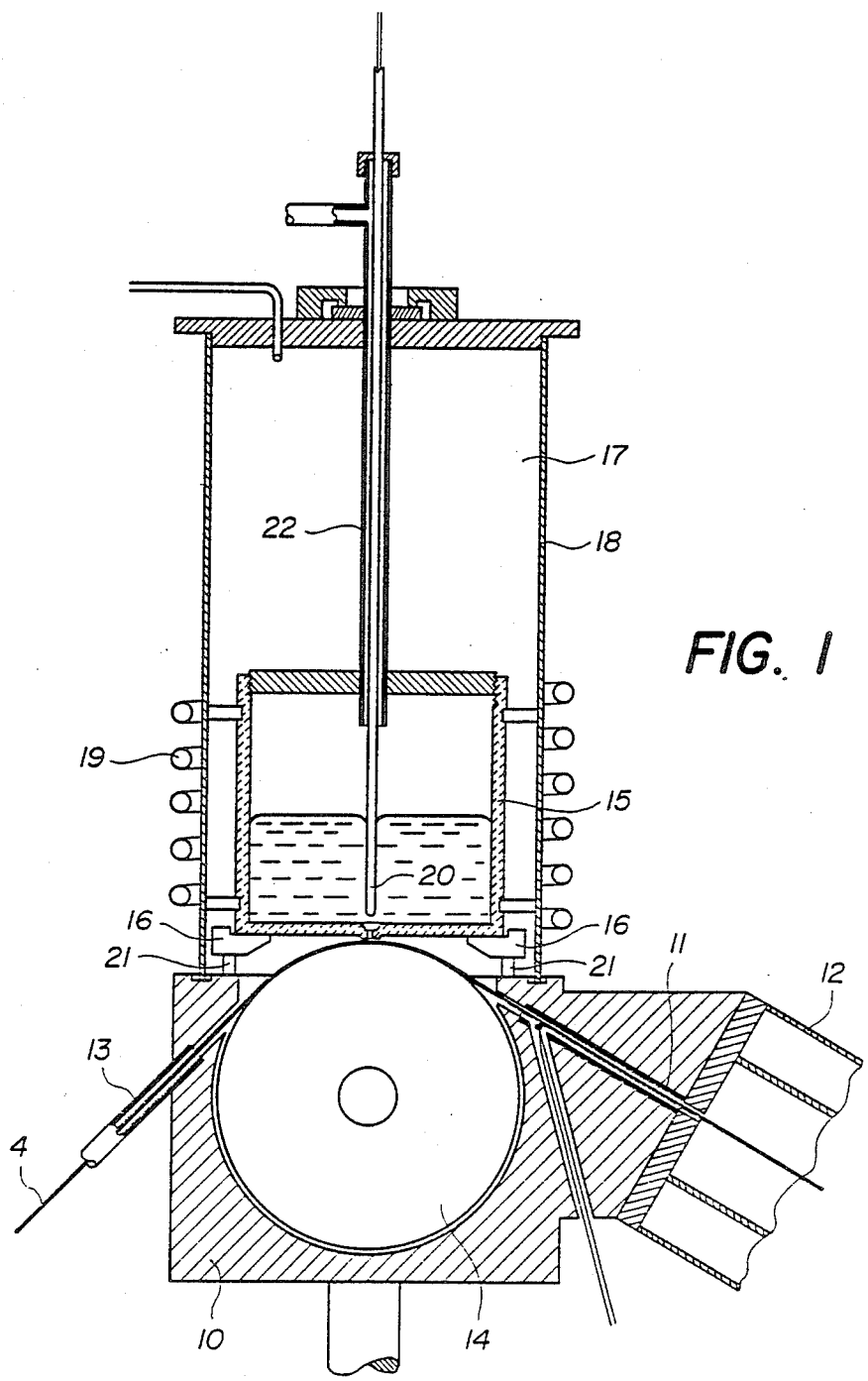

The actual plant as illustrated in FIG. 1 has a frame 10 comprising an inlet duct 11 for the strip to be coated after leaving a preheating chamber 12, an outlet duct 13 associated with a cold-water cooling circuit (not shown), a graphite cylinder 14 rotatably mounted on the frame and cooled by a water circuit (not shown). A crucible 15 rests on an annular ceramic support 16 positioned by means of adjusting screws 21. This crucible is accommodated inside a closed chamber 17, the side wall of which consists of a quartz tube 18, and is heated, by means of high-frequency induction, by a coil 19 arranged around the quartz tube 18. The chamber 17 is supplied with neutral gas of the type $N_2$ - 10% $H_2$. A thermocouple 20 is arranged inside the crucible 15 in order to measure the temperature of the metal and passes through a tube 22 intended to be connected to the neutral-gas source so as to create a dynamic pressure inside the crucible, which pressure is intended to be added to the static pressure resulting from the liquid-metal head.

Figure 2:
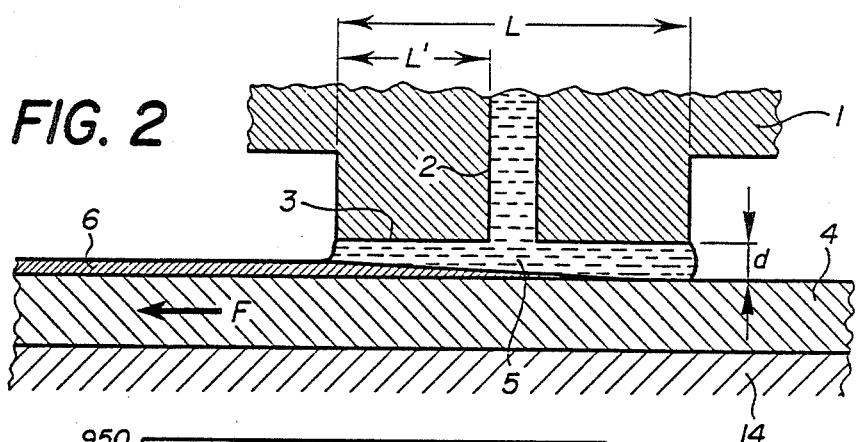
FIG. 2 is a very schematic and enlarged partial side view of FIG. 1 showing the parameters associated with implementation of the method.
Figure 4:
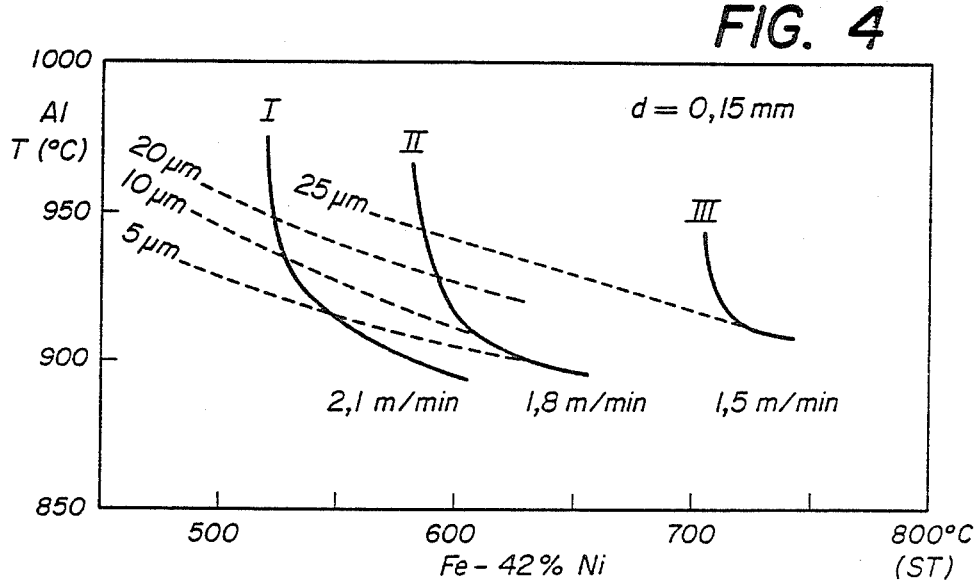

FIG. 2 shows a nozzle 1 comprising a liquid-metal supply duct 2 connected to the crucible 15 (FIG. 4). This nozzle ends in lips 3 which protrude underneath the bottom of the crucible, on either side of the supply duct 2, parallel to the direction of displacement of the substrate to be coated 4. The liquid metal 5 leaving the supply duct 2 of the nozzle 1 spreads, by means of capilarity, between the substrate 4 and the lips 3 of the nozzle 1. As the substrate moves in the direction of the arrow F, a portion of the liquid metal solidifies upon coming into contact with this substrate and is carried along with the latter so as to form the coating 6.

The first condition which must be achieved is perfect adhesion of the coating 6 to the substrate 4. For this purpose, the substrate must be heated to a temperature lower than its melting temperature which is itself higher than that of the metal intended to form the coating 6. This adhesion is dependent on perfect wetting of the substrate, which can only be guaranteed if there is a long enough contact time between this substrate and the molten metal before the coating 6 starts to solidify. During wetting of the substrate 4 by the liquid metal 5, the metal of the substrate 4 diffuses into the coating metal and forms, together with the latter, intermetallic compounds which change the physical properties of the coating metal. Generally, with this coating method, diffusion of the substrate metal is so extensive that the intermetallic compound or compounds affect most of the thickness of the coating, the remainder of this coating comprising, in the form of an alloy, the substrate metal such that the metal of the coating is not in a more or less pure state or at least in a state which is sufficiently pure for several applications for which it is intended.

To overcome this drawback, without adversely affecting adhesion of the coating to the substrate, a set of conditions must be created which, once wetting of the substrate 4 has been performed, ensure that the coating solidifies as rapidly as possible and more rapidly than the speed at which the substrate metal diffuses into the liquid metal deposited on its surface, so as to stop diffusion as close as possible to the substrate and ensure that a maximum amount of the coating 6 consists of metal which is as pure as possible and that the layer of intermetallic compound is as thin as possible. Obviously, there are many parameters which come into play. These are linked firstly, to constructional dimensions of the plant, secondly, to operating conditions and, thirdly, to the speed at which the substrate metal diffuses into the coating metal, as well as to the phase diagram for the metals used. Consequently, if the process leading to the formation of a coating consisting of metal which is as pure as possible (or of a given alloy) can be explained by the above theory relating to dissolution and solidification speeds, it will be readily understood that it is difficult to make a general rule. Such a rule is dependent not only on the operating conditions, but also on the tendency of the various metals present to form one or more intermetallic compounds, at different temperatures during cooling of the coating. In certain cases, the metals present thus have a more or less marked tendancy to form one or several intermetallic compounds, thereby resulting in a more or less thick layer of this/these compound(s) in the coating. However, a series of tests, carried out with different metals or alloys used to form coatings on substrates consisting of other metals or alloys having melting points higher than those of the metals or alloys deposited, have shown it is possible to obtain coatings with a thickness of between 5 and 50 $\mu$m, these coatings comprising a layer of intermetallic compound with a thickness not greater than 0.5 to 4 $\mu$m and not exceeding 50% of the total thickness of the coating, and to ensure that the initial coating metal or alloy constitutes at least 97% of the remainder of this coating. It will be seen in the example which follow that, in many cases, the abovementioned limits may be reduced considerably and that it is possible to obtain coatings for technologies with standards as high as those needed for integrated circuit connection bases for example, where the required degree of purity of the coating metal and the thickness of the intermetallic layer must satisfy very stringent requirements.

All of the examples mentioned were obtained using the same plant, the lips 3 of the nozzle 1 having a total length L of 2.7 mm, the supply duct 2 of the nozzle having a circular or rectangular cross-section depending on the width of the coating required. The distance d between the lips 3 of the nozzle 1 and the substrate 4 is of quite considerable importance. Under no circumstances may it exceed 0.5 mm and generally it is about 0.15 mm, or even less, whatever the thickness of the coating. The length L of the lips 3 situated on either side of the duct 2 must have a minimum dimension of the order of 2 mm; as for the dimension L', it must be between 1 and 5 mm. The duct 2 may be arranged off-centre, towards the rear of the nozzle 1 and relative to the direction of movement F of the substrate 4. It must be pointed out that, in this particular case, the plant has a nozzle with a vertical axis, the surface of the substrate on which deposition is effected being horizontal. However, if this position facilitates implementation, it is possible for the axis of the nozzle to be horizontal and for the substrate to be vertical and to move from the bottom upwards since the liquid metal forms a meniscus between the substrate and the lips 3 of the nozzle under the action of capillary forces.

As illustrated in FIG. 1, the substrate strip 4, which has been previously heated, passes onto the cylinder 14 which rotates at the same speed as the strip. The rear side of the strip starts to cool the instant the molten metal is deposited on the front side. Consequently, cooling of the liquid metal commences at the interface with the substrate, thus reducing the time during which the substrate metal is able to diffuse into the liquid metal. In the case of a thin substrate, this feature is important since, on the one hand, the distance between the strip 4 and the nozzle 1 must be kept constant and, on the other hand, it is important to cool the strip, the temperature lag being very low on account of its thickness. Since the strip must be supported in order to prevent it vibrating, the most rapid cooling effect can only be obtained by means of the support itself, and hence the advantage of using a rotating support, the cooling surface of which constantly changes and which itself has the time to cool before coming into contact again with another portion of the strip. The cylindrical shape of the support is important, in that it allows tension to be exerted on the strip 4 and ensures that the latter makes proper contact with the support, thus preventing the strip from vibrating and at the same time guaranteeing efficient heat transfer between the strip and the support cylinder 14.

After leaving the surface of the cylinder 14, the strip enters the cooling duct inside which it is sprayed with a fine liquid spray in order to complete the cooling process.

EXAMPLE 1

This example relates to the deposition of a 99.99% aluminium track on a substrate consisting of a strip of Fe - 42% Ni.

The operating conditions of the deposition method are as follows: the substrate 4 is preheated to 620° C., the aluminium is melted at a temperature of 910° C. The nozzle 1 is made of graphite and the supply duct 2 has a rectangular cross-section of 0.7×5.0 mm, the main axis of this cross-section being in a plane prependicular to the drawing. A pressure equivalent to a 200 mm water column is applied to the liquid metal. Before coating, the surface of the substrate is degreased in an alkaline solution and is then scoured with acid. Coating is performed in an atmosphere of $N_2$ - 10% $H_2$ and cooling of the coated substrate is carried out in water. The speed of displacement of the substrate is 1.8 m/min.

The characteristics of the product obtained are as follows: the maximum thickness of the coating is 12 $\mu$m and the average thickness is 8 $\mu$m, the surface roughness (peak-to-valley height) being 0.05 $\mu$m. The layer of intermetallic compound at the interface is a layer of $(NiFe)AL_3$ of 0.9 $\mu$m thickness, the Vickers hardness of the coating is 52, the composition of the aluminium layer comprises 1% by weight of (Ni+Fe), there is no change in the colour and adhesion of the coating is good.

EXAMPLE 2

Again there is a substrate of Fe - 42% Ni covered with a track consisting of 99.9% Al. The substrate is preheated to 520° C. and the aluminium is melted at 945° C. The substrate 4 is displaced underneath the nozzle 1 at a speed of 2.1 m/min, the distance between the lips 3 and the substrate 4 still being 0.15 mm. The pressure applied to the liquid metal is equivalent to a 300 mm water column. The nozzle is the same as in Example 1, i.e. it has an orifice of 0.7×5.0 mm. Preparation of the strip (substrate) is performed in the same manner as in Example 1 and the coating atmosphere also consists of $N_2 + 10\% H_2$.

The coating obtained has a maximum thickness of 13 $\mu$m and an average thickness of 11 $\mu$m. The surface roughness (peak-to-valley height) of the coating is 0.02 $\mu$m. The layer of intermetallic compound $(NiFe)Al_3$ at the interface has a thickness of 1.3$\mu$m, the Al content of the coating above this layer of intermetallic compound is greater than 98.5% by weight, the Vickers hardness is 54 and the adhesion is good.

EXAMPLE 3

99.99% Al is deposited on Fe - 42% Ni under conditions similar to those of Example 2, and an average thickness of 23 $\mu$m, with a layer of intermetallic compound of 1.6 $\mu$m, and an Al concentration, in the coating, of 98% by weight in the coating are obtained.

Figure 3:
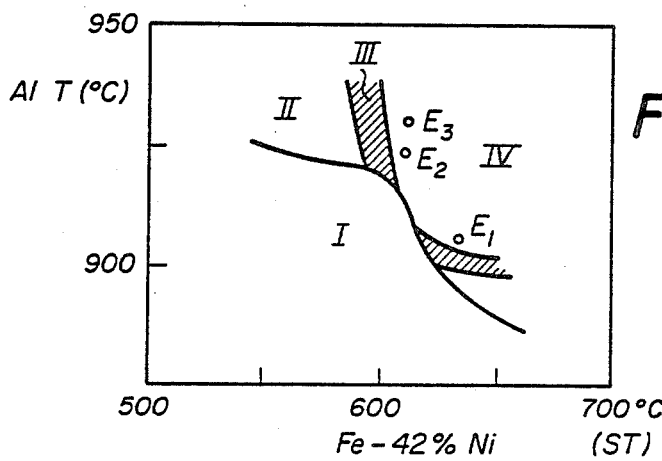
FIGS. 3 and 4 are diagrams relating to different operating parameters.

The diagram shown in FIG. 3 was obtained by plotting the temperature of the substrate (ST) along the abscissa and the temperature of the deposited aluminium (AlT) along the ordinate. The constants were the speed of the substrate (1.8 m/min), the composition of the substrate (Fe - 42% Ni), the metal used for coating the substrate (99.99% Al), the distance between the substrate and the lips 3 of the nozzle (0.15 mm) and the width of the aluminium track deposited (5.0 mm).

This diagram shows four zones: a zone 1 in which wetting of the substrate is incomplete, a zone II in which particles of intermetallic compounds exist throughout the thickness of the coating, a zone III which constitutes a transition zone and a zone IV in which there are three points $E_1$, $E_2$, $E_3$ corresponding to the abovementioned examples 1, 2 and 3, respectively.

The diagram in FIG. 4 shows a system of coordinates X, Y giving the temperatures of the substrate (ST) and of the aluminium (ALT), respectively, and the operating limits which are located at the right of the curves I, II and III for substrate speeds of 2.1 m/min, 1.8 m/min and 1.5 m/min, respectively. The curves shown in broken lines represent the minimum thicknesses (5 $\mu$m, 10 $\mu$m, 20 $\mu$m and 25 $\mu$m) which can be obtained at these different speeds, in all cases for depositions consisting of 99.99% Al.

EXAMPLE 4

99.99% Al is deposited onto a substrate of 99.95% Cu, heating the substrate to 425° C. and melting the aluminium at a temperature of 795° C. The speed of displacement of the substrate is 6.0 m/min, the distance between the substrate and the nozzle is 0.15 mm and the pressure applied to the liquid metal is equivalent to a 400 mm water column, the metallostatic pressure being equivalent to 20 mm. The duct 2 of the nozzle is cylindrical and its diameter is 1.05 mm.

The substrate is degreased beforehand using a solvent, coating is performed in an argon atmosphere and cooling is carried out by means of air at a rate of 5° C./s.

The coating obtained has a thickness of 15 $\mu$m and a Vickers hardness of 54. The thickness of the layer of intermetallic compound at the surface of the substrate is 2.0 $\mu$m, the remainder of the coating comprising more than 97% Al.

EXAMPLE 5

99.5% Al is deposited onto a substrate of 99.95% Cu, the latter being heated to 440° C. and the aluminium being melted at a temperature of 820° C. The speed of displacement of the substrate is 4.8 m/min. The distance between the substrate and the nozzle is 0.4 mm. The pressure applied to the molten metal is equivalent to a 700 mm water column, while the metallostatic pressure is equivalent to 25 mm. The duct of the nozzle has circular cross-section with a diameter of 1.2 mm.

The substrate is not subjected to any treatment prior to coating which is performed in an atmosphere of 10% $H_2$ - $N_2$ followed by air cooling at a rate of 50° C./s.

The coating obtained has a thickness of 12 $\mu$m and a Vickers hardness of 56. The thickness of the layer of intermetallic compound is 4 $\mu$m, the remainder of the coating comprising more than 98.5% Al.

EXAMPLE 6

Pb - 5% Sn is deposited onto a substrate of Cu - 4% Sn, the latter being heated to 276° C. and the Pb - 5% Sn alloy being heated to 425° C. The speed of displacement of the substrate is 4.7 m/min and the distance between the nozzle and the substrate is 0.08 mm. The pressure exerted on the liquid metal is equivalent to a 200 mm water column. The supply duct of the nozzle has a rectangular cross-section of 0.7×12.0 mm.

The substrate strip is degreased beforehand using an alkaline solution and lightly scoured with acid. Coating is performed in an atmosphere of 10% $H_2$ - $N_2$ with water cooling.

The coating has a maximum thickness of 22 $\mu$m and an average thickness of 20 $\mu$m, a Vickers hardness of 40 and a surface roughness of 0.05 $\mu$m. The layer of intermetallic compound of ($Cu_6Sn_5$) at the surface of the substrate has a thickness of 2.0 $\mu$m, the remainder of the layer comprising less than 1% Cu. The colour of the coating does not change.

EXAMPLE 7

Pb - 5% Sn is deposited onto a substrate of Cu - 4% Sn, the latter being heated to 330° C. and the coating alloy being melted at a temperature of 438° C. The speed of displacement of the substrate is 2.1 m/min and the distance between the nozzle and the substrate is 0.35 mm. The pressure exerted on the molten metal is equivalent to a 180 mm water column. The supply duct of the graphite nozzle has a circular cross-section with a diameter of 1.2 mm.

The substrate strip is degreased beforehand in an alkaline solution. Coating is performed in an atmosphere of 10% $H_2$ - $N_2$, followed by cooling in water.

The coating obtained has a maximum thickness of 44 $\mu$m and an average thickness of 22 $\mu$m; it has a Vickers hardness of 40 and a surface roughness of 0.02 $\mu$m. The layer of intermetallic compound ($Cu_6Sn_5$) at the surface of the substrate has a thickness of 2.5 $\mu$m, the remainder of the layer comprising less than 1% Cu. Adhesion is good.

EXAMPLE 8

95% Pb 5% is deposited onto a substrate of Cu - 4% Sn, the latter being heated to 290° C., while the deposited alloy is heated to 425° C. The speed of the substrate is 7.8 m/min and the distance between the nozzle and the substrate is 0.45 mm. The pressure exerted on the liquid metal is equivalent to a 200 mm water column. The duct of the graphite nozzle has a rectangular cross-section of 0.7×5.0 mm.

The substrate strip is degreased beforehand using an alkaline solution and scoured with acid. Coating is performed in an atmosphere of 10% $H_2$- $N_2$, followed by cooling with water.

The coating obtained has a maximum thickness of 38 $\mu$m and an average thickness of 33 $\mu$m; it has a Vickers hardness of 50 and a surface roughness of 0.1 $\mu$m. The layer of intermetallic compound ($Cu_6Sn_5$) at the surface of the substrate has a thickness of 0.5 $\mu$m, the remainder of the layer comprising less than 1% Cu. Adhesion of the coating is good.

EXAMPLE 9

99.95% Al is deposited onto a substrate of Cu - 4% Sn previously covered with 2$\mu$m Ni by means of electrolysis, this substrate being heated to 640° C. and the coating metal being heated to 970° C. The speed of the substrate is 2.1 m/min and the distance between the nozzle and the substrate is 0.10 mm. The pressure exerted on the liquid metal is equivalent to a 200 mm water column. The supply duct of the graphite nozzle has a rectangular cross-section of 0.7×5.0 mm.

The substrate strip is degreased beforehand using an alkaline solution and is subjected to electrolytic scouring. Coating is performed in an atmosphere of 10% $H_2$ - $N_2$, followed by water cooling.

The coating thus obtained has a maximum thickness of 5.0 $\mu$m and an average thickness of 4.5 $\mu$m; it has a Vickers hardness of 54 and a surface roughness of 0.5 $\mu$m. The layer of intermetallic compound ($NiAl_3$) at the surface of the substrate has a thickness of 0.5 $\mu$m, the remainder of the layer comprising 1.0% Ni by weight. Adhesion is good.

EXAMPLE 10

99.95% Al is deposited onto a substrate of Cu - 4% Sn, the latter being heated to 520° C., while the coating metal is melted at a temperature of 840° C. The speed of the substrate is 4.4 m/min and the distance between the nozzle and the substrate is 0.15 mm. The pressure exerted on the liquid metal is equivalent to a 200 mm water column. The duct of the graphite nozzle has a rectangular cross-section of 0.7×5.0 mm.

The substrate strip is degreased beforehand using an alkaline solution and scoured electrolytically. Coating is performed in an atmosphere of $N_2$ - 10% $H_2$, followed by water cooling.

The coating obtained has a maximum thickness of 6 $\mu$m and an average thickness of 5 $\mu$m; it has a Vickers hardness of 54 and a surface roughness of 0.05 $\mu$m. At the surface of the substrate there are two layers of intermetallic compound, CuAl and CuAl$_2$, which have a thickness of 1 μm. The remainder of the layer comprises less than 3% by weight of Cu. The coating metal does not change colour and has good adhesion properties.

It will be noted that prior coating of the substrate with nickel deposited electrolytically, as in Example 9, enables the purity of the coating deposited on the substrate to be increased considerably. The coating according to Example 9 satisifies all the requirements for the manufacture of integrated circuit connection bases. In fact, the aluminium of the coating must possess a purity of more than 99% by weight, a thickness of between 4 and 10 μm±1 μm, and a width of between 2 and 10 mm±0.2 mm. The surface roughness (peak-to-valley height) must be 0.1 μm. The structure of the layer must not have any faults, the thickness of the intermediate layer must be less than 1 μm and the Vickers hardness less than 70.

The Pb - 5% Sn coatings of Examples 5, 6 and 7 satisfy in particular the requirements for coating the connection lugs of integrated circuit bases. Dissolution of the substrate copper must be less than 1% by weight and the thickness of the layer of intermetallic compound must be less than 1 μm. The thickness must be between 4 and 50 μm, the width between 1 and 30 mm and the profile must be rectangular.

It will be noted that, despite the fact that a molten metal or alloy is deposited onto a preheated substrate, it has been possible to create operating conditions which limit the thickness of the intermetallic layer to between 0.5 and 5 μm and more generally to between 0.5 and 2.5 μm, this thickness being generally less than 25% of the thickness of the thinnest layers. Dissolution of the substrate metal is between 0.5 and 5% and more generally between 0.5 and 2.5% by weight.

EXAMPLE 11

Copper is deposited onto a strip of type UNS S31603 stainless steel (ASTM Standard), the 25×0.25 mm strip being made to move at a speed of 4.0 m/min and being preheated to 670° C. The distance between the substrate and the nozzle outlet is 120 μm, the length×width dimensions of the rectangular nozzle slit arranged transversely relative to the direction of movement of the strip are 20×0.7 mm, and the width of the lip which borders this slit downstream and upstream relative to the direction of movement of the strip is 1 mm on either side of this slit. The coating copper is 99.95% electrolytic copper and the total pressure at the nozzle outlet is equivalent to a 300 mm water column. The steel strip was degreased beforehand using an alkaline product and scoured with acid. Deposition is carried out in an atmosphere of N$_2$ - 10% H$_2$ and cooling, after the substrate leaves the graphite cylinder 14, is performed with water.

The coating thus obtained has a thickness of 30 μm. The purity of the coating strip metal is higher than 99%, the thickness of the intermetallic strip is 0 μm, the Vickers hardness is 80 and the surface roughness 0.5 μm.

EXAMPLE 12

The same metal is deposited on the same substrate as in Example 11, the substrate moving at 2.8 m/min. The molten metal has a temperature of 1340° C. and the substrate a temperature of 610° C. The distance between the substrate and the nozzle is 60 μm. The nozzle has a rectangular outlet orifice arranged transversely relatively to the direction of movement of the 0.7×5 mm substrate. The lip 3 arranged in front of the orifice 2 has a width L' of 2 mm and the lip located upstream has a width of 1 mm. The pressure of the liquid metal at the outlet is equivalent to a 300 mm water column.

The substrate was degreased beforehand in an alkaline solution and scoured with acid. The deposition atmosphere consists of N$_2$ - 10% H$_2$. Cooling upon leaving the graphite cylinder is performed with water.

The coating thus obtained has a thickness of 50 μm, a purity higher than 99%, an intermetallic layer of 0 μm, a Vickers hardness of 80 and a surface roughness of 0.8 μm.

EXAMPLE 13

Cu - 5% Pb is deposited onto the same substrate as in Examples 11 and 12. The speed of the substrate is 3.6 m/min, the temperature of the molten alloy is 1160° C., the temperature of the substrate is 550° C. and the distance between the nozzle and the substrate is 60 μm. The dimensions of the nozzle outlet orifice arranged transversely relatively to the direction of movement of the substrate are 0.7×5 mm, and the width of the lips 3 arranged on either side is 3 mm. The pressure at the nozzle outlet is equivalent to a 100 mm water column.

The conditions for preparing the substrate, the atmosphere and the cooling method are the same as those in Examples 11 and 12.

The coating has a thickness of 40 μm, a purity higher than 98%, an intermetallic layer of 0.5 μm, a Vickers hardness of 110 and a surface roughness of 0.5 μm.

EXAMPLE 14

99.95% Al is deposited on a substrate of Fe - 42% Ni moving at 6.0 m/min, the aluminum being heated to 740° C. and the substrate to 615° C., and a pressure equivalent to 200 mm water head being exerted at the nozzle outlet. The distance between the nozzle and the substrate is 250 μm. The nozzle has an orifice which is rectangular and arranged tranversely relative to the 0.7×5 mm substrate strip and 2 mm (lips on either side of the orifice 2.

The preparation conditions, the atmosphere and the cooling method are the same as those in Examples 11 to 13.

The coating obtained has a thickness of 30 μm, a purity higher than 98%, an intermetallic layer of 0.4 μm, a Vickers hardness of 50 and a surface roughness of 0.8 μm.

EXAMPLE 15

Pb 3.5% Sn 1.5% Ag is deposited on a substrate of Ni which moves at 12.0 m/min, the Pb alloy being heated to 490° C. and the substrate to 280° C. The distance between the nozzle and the substrate is 250 μm and the pressure at the nozzle outlet is equivalent to a 200 mm water column. The nozzle has a rectangular orifice of 0.7×12 mm and a lip with a width of 1 mm downstream of the orifice and 2 mm upstream of it.

The deposition conditions are the same as those for Examples 11 to 14.

The coating obtained has a thickness of 50 μm, a purity higher than 99%, an intermetallic layer of 0.3 μm, a Vickers hardness of 80 and a surface roughness of 0.7 μm.

We claim:

1. A method of forming an alloy or metal coating on a metal substrate comprising the steps of:

(a) heating said substrate to a temperature of from 0.60 to 0.95 of the melting point of the alloy or metal material to be used for coating;

(b) melting said alloy or metal material at a temperature of from one to two times the melting point thereof;

(c) depositing said molten alloy or metal on said substrate via a nozzle at a pressure of from 50 to 500 mm $H_2O$;

said substrate moving relative to said nozzle at from 1 to 15 m/min, at a distance of from 50 to 500 mm from the nozzle outlet, where said nozzle outlet measures from 0.3 to 1.0 mm in the direction of movement of the substrate, and where a surface defining the outlet of the nozzle extends from about 0.5 to 5 mm in the direction of substrate movement; thereby (d) forming a coating of said alloy or metal material having a thickness of from 4 $\mu$m to 50 $\mu$m;

such that an intermetallic layer formed at the coating/substrate interface has a thickness of between 0.5 and 4 $\mu$m, but which thickness does not exceed 40% of the total thickness of said coating, the balance of the coating consisting of the initial alloy or metal of between 97 and 99.5% purity.

2. The method of claim 1, wherein the distance between the nozzle outlet and said substrate is fixed by causing the substrate to move on a support.

3. The method of claim 2 further comprising the step of cooling said substrate by conduction via said support.

4. The method of claim 3, wherein said support is cylindrically shaped and the support is driven so as to carry the substrate at a speed of from 1 to 15 m/min.

5. The method of claim 3 comprising the step of further cooling said substrate by use of a cooling fluid.

6. The method of claim 1 wherein the distance from the nozzle outlet to the substrate is from 150 to 200 $\mu$m.

7. The method of claim 1, wherein said nozzle is oriented substantially vertically and perpendicular to said substrate.

* * * * *